United States Patent [19]

Kawaura

[11] Patent Number: 5,635,672
[45] Date of Patent: Jun. 3, 1997

[54] PACKAGE FOR ELECTRONIC ELEMENT

[75] Inventor: Shigehiro Kawaura, Toyama, Japan

[73] Assignee: Nippon Carbide Kogyo Kabushiki Kaisha, Tokyo, Japan

[21] Appl. No.: 513,989

[22] PCT Filed: Jan. 19, 1995

[86] PCT No.: PCT/JP95/00049

§ 371 Date: Sep. 5, 1995

§ 102(e) Date: Sep. 5, 1995

[87] PCT Pub. No.: WO95/20244

PCT Pub. Date: Jul. 27, 1995

[30] Foreign Application Priority Data

Jan. 21, 1994 [JP] Japan ..................... 6-019815

[51] Int. Cl.⁶ ..................................... H05K 5/06
[52] U.S. Cl. .................. 174/52.3; 310/344; 361/809; 257/704
[58] Field of Search ............. 310/312, 313 B, 310/313 C, 320, 340, 344; 174/50, 50.5, 50.51, 52.1, 52.3, 66; 257/678, 701, 703, 704; 361/600, 641, 728, 807, 809, 812, 816, 818

[56] References Cited

U.S. PATENT DOCUMENTS

| 4,472,652 | 9/1984 | Brice et al. | 310/313 B |
| 4,480,262 | 10/1984 | Butt | 357/74 |
| 4,542,259 | 9/1985 | Butt | 174/52 FP |
| 4,814,943 | 3/1989 | Okuaki | 361/400 |
| 4,930,345 | 6/1990 | Bausch | 73/45.4 |
| 5,473,216 | 12/1995 | Brosig | 310/346 |

FOREIGN PATENT DOCUMENTS

| 2 458 150 | 12/1980 | France . |
| 60-66836 | 4/1985 | Japan . |
| 2-271556 | 11/1990 | Japan . |
| 4-107955 | 4/1992 | Japan . |

*Primary Examiner*—Gerald P. Tolin
*Attorney, Agent, or Firm*—Young & Thompson

[57] ABSTRACT

The hermetically sealed package for an electronic device of the present invention comprises a body containing an electronic device therein and a covering member, such as a cap or a lid, for covering the body. The package is characterized in that the covering member of the package comprises a metal foil, and the covering member and the body are sealed together with a resin adhesive.

11 Claims, 1 Drawing Sheet

PACKAGE FOR ELECTRONIC ELEMENT

TECHNICAL FIELD

This invention relates to a hermetically sealed package fop an electronic device (hereinafter sometimes simply referred to as a device) in which the sealing is carried out under milder conditions than have conventionally been used. The package of the present invention is applicable to packaging of a wide range of devices.

BACKGROUND ART

Electronic devices include a variety of kinds, and most of them ape not resistant against the environment as they are. That is, if exposed as such in the air, a device undergoes deterioration by moisture, oxygen or other corrosive substances in the air and reduces its functions.

Among such delicate devices are included semiconductor devices such as IC, LSI, transistors, And diodes; piezoelectric devices; oscillators; condensers; and resistors.

These devices do not withstand long-term use stably unless some protection against the environment is afforded. Protection is, in principle, to prevent a device from being exposed directly to air and includes various means, from simple coating to packaging, i.e., perfect hermetic sealing, selected according to the type of the device, the purpose of protection or the degree of desired protection.

Of these protecting means, a "package" is important. While "package" in general covers a considerably broad concept, the term "package" as used herein means a hollow container, comprising a body in which a device is to be put and a cap or lid for covering the body, the body and the cap or lid being hermetically sealed.

The above-mentioned package has a sealing part at which the body and the cap or lid are adhered to each other, and this part has great influences on the airtightness of the whole package.

A widely used method for hermetically sealing the body and the cap or lid is "adhesion" in its broad sense. The term "adhesion" in its broad sense embraces not only mere adhesion with an adhesive but welding and fusing.

Where sealed areas are made of metal, they may be subjected to welding or silver soldering. Sealed areas made of ceramic or glass may be fused together with a glassy adhesive. Resin adhesives may be used irrespective of the material to be adhered.

However, the former two methods mentioned above require heating to such a high temperature that the device might be damaged, and are therefore unsuitable to those devices which are easily deteriorated at high temperatures. Besides, these methods incur high cost.

Adhesion with a resin adhesive is preferred for the low sealing temperature and the low sealing cost but has a disadvantage of low retention of airtightness, in particular, low impermeability to moisture. Therefore, resin adhesives have not yet been widespread in those packages requiring long-term reliability.

DISCLOSURE OF THE INVENTION

An object of the present invention is to eliminate the disadvantages associated with use of a resin adhesive in package sealing and to provide a widely applicable resin-sealed package.

In the present invention, use of a metal foil as a covering member of a package for an electronic device provides sufficient hermetic seal even with a resin adhesive, thereby accomplishing the above object.

The inventors of the present invention first of all evaluated airtightness of conventional resin-sealed packages in terms of moisture impermeability. Since it is not easy to measure change of humidity inside a package, a package for a quartz oscillator, which suffers appreciable deterioration of characteristics by humidity, was tested under accelerated conditions in a pressure cooker.

The accelerated test was conducted as follows. A quartz oscillator, the oscillation frequency of which had previously been measured, was sealed into a package. The frequencies were measured before and after sealing, and the difference between them was taken as an initial change. The sealed test piece was kept in saturated steam at 121° C. under 2 atm in a pressure cooker and taken out occasionally to measure the oscillation frequency to obtain changes with time. The measurement continued for 48 hours at the longest.

A 96% alumina-made package shown in FIG. 3 that is widely known and used in the art was used. The package of this type is usually sealed with a glass adhesive with a low melting point.

A quartz oscillator was mounted in the package in a usual manner and sealed with the low-melting glass. The highest maximum temperature at the sealing was 430° C. Ten test pieces were thus prepared and, after measuring the initial change of frequency due to sealing, subjected to the pressure cooker test.

The frequency showed a reducing tendency during the pressure cooker test. The reduction after 48 hours was 5 ppm at the maximum and 1 ppm at the minimum, averaging 3.5 ppm for the ten test pieces.

Since a package whose change in frequency in 48 hours' testing in a pressure cooker is within 15 ppm is regarded non-problematical in ordinary use, the conventional glass-sealed ceramic package withstands practical use sufficiently.

However, the test pieces suffered a considerable initial change, i.e., an increase of frequency due to the high temperature of sealing, which reached 50 ppm at the most. Therefore, some of the test pieces failed to clear the target tolerance of frequency and reduced the productivity.

Then, the same packages were sealed using polysulfone as a heat-resistant thermoplastic adhesive or an epoxy resin as a thermosetting adhesive at a sealing temperature of 310° C. or 190° C., respectively.

Ten test pieces were prepared for each. The maximum initial change of frequency due to sealing was 18 ppm in the case of polysulfone sealing and 5 ppm in the case of epoxy resin sealing. Therefore, the initial change of frequency due to sealing was much smaller than in the glass sealing, showing an improvement in productivity in terms of target tolerance of frequency.

The test pieces were subjected to the pressure cooker test. The frequency change after 24 hours' testing exceeded 50 ppm in the case of polysulfone sealing and 30 ppm in the case of epoxy sealing. Accordingly, these resin-sealed packages had insufficient moisture resistance in practical use.

On comparing conventional glass sealing and resin sealing, resin sealing causes smaller initial changes of frequency due to sealing owing to the lower sealing temperatures, whereas glass sealing is far superior in moisture impermeability.

The above results show that resin adhesives lack moisture impermeability. Therefore, to reduce moisture permeability of resin adhesives would be one of the possible approaches to the realization of resin sealing, but it is not at all easy to reduce moisture permeability of resin adhesives without impairing adhesion properties, heat resistance, mechanical strength, and the like.

Another approach to improve moisture impermeability of a package is to make the passageway for moisture as small as possible. With external conditions being equal, the rate of moisture permeation is determined by the length and cross-sectional area of the passageway for moisture. The length of the passageway for moisture corresponds to the width of the sealed area, which is almost automatically determined according to the choice of the shape and dimension of a package.

However, the cross-sectional area of the passageway, namely the thickness of the adhesive layer is greatly influenced by the flatness of sealed areas. Since conventionally employed sealing methods achieve substantially perfect prevention of moisture permeation, flatness of the sealed areas that allows complete sealing has been enough and not so strictly demanded. This means that the sealed areas of the conventional packages do not always make intimate contact, not infrequently having gaps therebetween. Such gaps would allow considerable moisture permeation in the case of sealing with resin adhesives.

For example, production of alumina-made packages as used in the above-described tests involves a sintering step, in which the package undergoes overall shrinkage. Shrinkage by no means occurs uniformly on a microscopic level, and a package suffers from microscopic unevenness, warpage or waviness, resulting in poor contact of the sealed areas, even if the package shows no distortion as a whole.

Improvement in flatness of sealed areas, that is, degree of intimate contact is expected to provide improved moisture impermeability even in sealing with a resin adhesive. However, in order to improve the flatness of sealed areas of the above-mentioned alumina-made package, it is necessary to conduct polishing. Polishing of alumina which may be mentioned as a typical ultrahard substance entails great cost and cannot be adopted for resin-sealed packages which aim at cost saving. Besides, polishing itself is sometimes difficult depending on the shape of a package.

Hence, the inventors of the present invention conducted extensive investigations on other methods for improving intimate contact of sealed areas and have found, as a result, that sufficient airtightness of a hermetically sealed package for an electronic device comprising a body which contains an electronic device therein and a covering member, such as a cap and a lid, which covers the body can be assured by using a metal foil as a covering member of the package and sealing together the covering member and the body with a resin adhesive. The present invention has been reached by this finding.

In the present invention, the metal foil is used as a covering member of the package. The term "metal foil" as used herein means a metal foil having melleability or ductility (i.e., deformability) to some extent.

When the covering member comprising the metal foil is adhered to the body with a resin adhesive, appropriate pressure is applied thereon so that the metal foil undergoes deformation in agreement with the unevenness, warpage or waviness on the sealed areas of the body, whereby the gaps in the sealed areas are made smaller to improve moisture impermeability. The present invention thus provides a highly hermetic package which uses a resin adhesive and yet serves for practical use.

BRIEF DESCRIPTION OF THE DRAWINGS

The present invention will be described in greater detail by referring to the accompanying drawings in which.

THE KNOWN MODE FOR CARRYING OUT THE INVENTION

Figure 1:
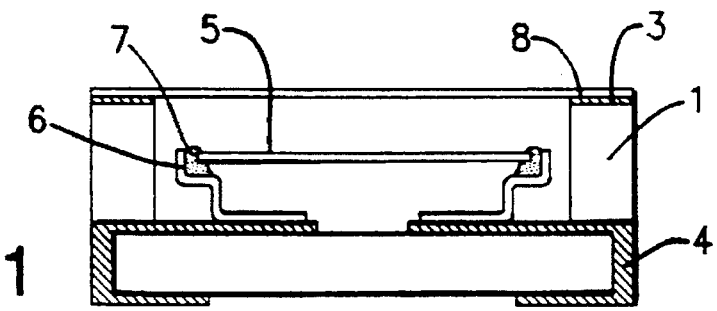
FIG. 1 is a cross-sectional view of the package according to the present invention.

Specific embodiments for carrying out the present invention will be described below, but the present invention should not be construed as being limited thereto, and includes all the modifications and variations within the scope of the present invention.

As previously stated, the term "package" as used herein means a hollow container comprising a body which contains a device and a covering member which covers the opening of the body, the body and the covering member being adhered together for hermetic sealing after the device has been put into the body. The device should be kept electrically unconnected to the body. Therefore, the body preferably comprises an insulating material. Where the body comprises an electrically conducting material such as a metal, the device should be held with no electrical connection to the body.

Leads for connecting the device to the outside are provided on the body.

Taking the above-mentioned requirements for the body into consideration, the body preferably comprises ceramics, glass or plastics. Of these materials, oxide ceramics such as alumina, steatite, forsterite, mullite and cordierite are preferably used for the cost and excellent processability, insulating properties, and thermal resistance.

Any metallic material capable of forming a foil having melleability or ductility (i.e., deformability) to some extent may be used as a material of the metal foil. Not only a single metal but an alloy may be used. Examples of the metals include single metals, e.g., copper, iron, aluminum, zinc, tin, gold and silver; and alloys, e.g., copper alloys, aluminum alloys, stainless steel and Kovar. While not limiting, the metal foil preferably has a thickness of 0.005 to 0.3 mm because a metal foil thicker than 0.3 mm may tend to have insufficient malleability or ductility upon adhesion and a metal foil thinner than 0.005 mm may tend to have insufficient strength. A more preferred thickness is 0.005 to 0.15 mm, particularly 0.01 to 0.1 mm.

Some metal foils are corroded by water or oxygen in the air through long-term use. Such a disadvantage can be eliminated by subjecting the foil to a surface protective treatment, such as plating, coating or oxidation. In order to improve adhesiveness, it is advantageous that the surface of the metal foil to be adhered to the body is at least made roughened.

Of these metal foils, those which are easily available and are not expensive and exhibit stability over a prolonged period of time typically include a stainless steel foil, which can be used in the present invention for preference.

The degree of malleability or ductility required for the metal foil should be such that the foil may be deformed to some extent along the unevenness of the sealed area of the body, though varying depending on the flatness of the sealed area of the body and the size of the covering member. It is preferable for improving intimate contact that the surface of the metal foil to be adhered to the body is at least made roughened. The method for surface roughening is not particularly limited, and any of conventionally employed known methods may be used.

The resin adhesive to be used should be selected, as a matter of course, from among those having high moisture resistance. Since packages are often mounted on, for example, a printed circuit board and fixed with molten solder, the resin adhesive should have sufficient heat resistance to withstand the temperature of molten solder (about 250° to 280° C.) at least for a certain short time.

Resin adhesives satisfying these requirements include polysulfone, polyether sulfone and phenoxy resins as a heat-resistant thermoplastic resin adhesive.

These resin adhesives may be dissolved in an organic solvent upon use. In carrying out adhesion of the resin adhesive, the solution of the resin adhesive is applied onto areas to be sealed and, after evaporating the solvent to such an extent that the adhesiveness may not be lost, the body and the covering member are adhered to each other, followed by completely evaporating the solvent. Alternatively, after the solution is applied, the solvent is once evaporated completely, and the sealed areas of the body and the covering member are brought into contact, followed by heating up to the softening point of the resin adhesive.

Where there is a possibility that vapor of the solvent may damage the important part of the package, the latter method should be followed.

Thermosetting resin adhesives which can suitably be used in the present invention include epoxy resin adhesives. The epoxy resin adhesives have high adhesion to various materials including metals and exhibit satisfactory moisture resistance. They also have high heat resistance because of thermosetting properties. In addition, a variety of epoxy resin adhesives have been put on the market, offering a wide choice.

Therefore, epoxy resin adhesives are one of the most suitable adhesives for use in the present invention.

If desired, the resin adhesives may contain additives and fillers. In particular, addition of minerals inert to moisture, such as fine particles of glass, titanium oxide, alumina or silica, is advantageous to increase moisture impermeability of the adhered areas.

Sealing can be carried out in a conventional manner. That is, a resin adhesive is applied to either one or both of the body and the covering member. Application by screen printing is preferred; for the resin adhesive can be applied onto necessary portions to a relatively uniform thickness. Other methods such as roll coating and a brush coating may also be used.

Thereafter, the sealed areas between the body and the covering member are brought into contact with each other while the adhesive layer is in a state capable of adhesion, and the covering member is pressed onto the body. The action of "pressing" is of importance in the present invention. By this pressing action, most of the resin adhesive is pressed out of the sealed areas to become thinner and, at the same time, the metal foil changes its shape in conformity with the unevenness, warpage or waviness on the sealed area of the body while pressing the resin adhesive out of the sealed areas to form a thin adhesive layer.

Therefore, the pressing must be done in such a manner that the metal foil may be deformed in conformity with the surface flatness of the sealed area. This can be achieved with a slightly soft substance by imposing pressure uniformly on the sealed area of the metal foil.

Typical examples of such a substance are those having rubbery elasticity, such as a rubber plate, a rubber roller, a sponge plate and a sponge roller. In particular, a rubber plate or a sponge plate with its central portion being cut out so that the plate may be applied only to the sealed area is preferred for avoiding unnecessary deformation of the covering member.

The moisture impermeability of the package can be markedly improved by curing the resin adhesive while keeping the thickness of the adhesive layer between the metal foil and the body as small as possible.

While not always essential, it is advantageous for assuring protection of the device to conduct the above-mentioned adhesion step in an inert atmosphere, for example, in dry air or dry nitrogen.

As described above, the present invention makes it possible to apply resin adhesives which have hitherto been insufficient in terms of moisture impermeability to packages and is of very high value for practical use. The electronic devices which can be sealed into the package include semiconductor devices, e.g., IC, LSI, transistors, and diodes; piezoelectric devices, e.g., oscillators, filters comprising quartz and ceramic; condensers; and resistors. Piezoelectric devices, particularly quartz oscillators, are preferred devices to be sealed into the package because the piezoelectric devices are susceptible to the influences of adsorbed molecules (particularly water molecules) and need sufficient airtightness and moisture impermeability and therefore the present invention is advantageously applicable to these devices. The present invention is particularly suitable for quartz oscillators because they are apt to undergo frequency change due to adsorbed molecules such as adsorbed gas and adsorbed water, and need sufficient airtightness and moisture impermeability. Further, since the present invention uses a resin adhesive for sealing, it involves less thermal stress, causes less change in initial characteristics of an electronic device, and reduces the cost of packaging, and therefore the present invention is very advantageously applicable to practical use.

The present invention will now be illustrated below with reference to Examples, but it should not be construed as being limited thereto, and includes all the modifications and variations within the scope of the present invention.

EXAMPLE 1

The package shown in FIG. 1 was used as a package for a quartz oscillator. In FIG. 1, reference numeral 1 denotes a ceramic package body; 8 denotes 0.05 mm thick stainless steel foil; and 3 denotes sealed areas between the body 1 and the stainless steel foil 8. Leads 4 are provided on the body. Quartz oscillator 5 is fixed to metallic stem 6 with conductive adhesive 7.

Figure 2:
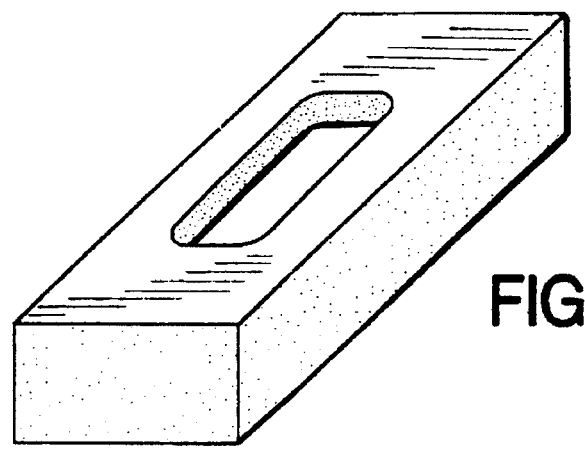
FIG. 2 is an illustration of a press pad made of sponge rubber.

The package body 1 and the stainless steel foil 8 were adhered with a resin adhesive. In adhering the stainless steel foil 8, sufficient pressure was applied onto the sealed ares 3 by means of a pressing pad as shown in FIG. 2 which was made of highly elastic sponge rubber having a high porosity.

Where polysulfone was used as a resin adhesive, the package was heated to 310° C. on sealing. The initial change in oscillation frequency of the quartz oscillator caused by this heating was 20 ppm at the maximum and 8 ppm at the minimum, giving an average of 13 ppm for 10 test pieces.

The 10 test pieces were subjected to a pressure cooker test. After 48 hours' testing, the maximum and minimum frequency changes were 12 ppm and 7 ppm, respectively, averaging 10 ppm.

Where an epoxy resin was used as a resin adhesive, the package was heated to 190° C. on sealing. The initial change in oscillation frequency of the quartz oscillator caused by this heating was 5 ppm at the maximum and 3 ppm at the minimum, giving an average of 4 ppm for 10 test pieces.

The 10 test pieces were subjected to a pressure cooker test. After 48 hours' testing, the maximum and minimum frequency changes were 13 ppm and 4 ppm, respectively, averaging 7 ppm.

EXAMPLE 2

As illustrated in the cross-sectional view of FIG. 1, the metallic stem 6 was fixed to the ceramic package body 1, and the quartz oscillator 5 was fixed to the metallic stem with the conductive adhesive 7. A 0.2 mm thick aluminum foil having been subjected to anodizing treatment was used as the metal foil 8. An epoxy resin was applied to sealed areas 3, and the aluminum foil 8 and the ceramic package body 1 were sealed together by heating to 190° C. and pressing by means of a pressing pad made of sponge rubber to prepare a test piece into which a quartz oscillator was sealed.

As a result of a 48-hour pressure cooker test on 10 test pieces, the changes in frequency before and after the test gave an average of 11 ppm.

EXAMPLE 3

Test pieces were prepared by the same manner as in Example 2, except for using a 0.1 mm thick Kovar foil as a covering member.

As a result of a 48-hour pressure cooker test on 10 test pieces, the changes in frequency before and after the test gave an average of 9 ppm.

EXAMPLE 4

Test pieces were prepared by the same manner as in Example 2, except for using as a covering member a 0.05 mm thick stainless steel foil with its side to be adhered having been subjected to surface roughening treatment with alumina powder (#150).

As a result of a 48-hour pressure cooker test on 10 test pieces, the changes in frequency before and after the test gave an average of 3 ppm.

Comparative Example 1

Figure 3:
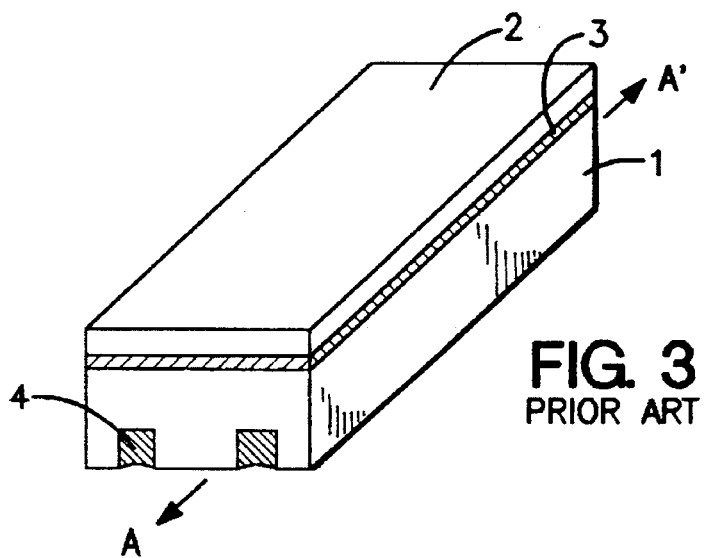
FIG. 3 is a perspective view of a conventional package made of 96% alumina.
Figure 4:
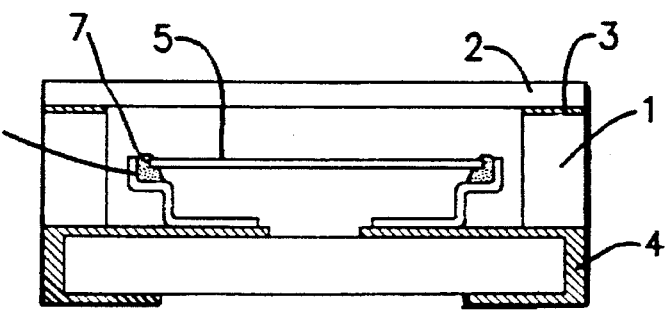
FIG. 4 is a cross-sectional view of the package taken along the A–A' line in FIG. 3.

Test pieces were prepared by the same manner as in Example 1, except for replacing the stainless steel foil 8 as in the package of FIG. 1 with a covering member made of ceramic 2 shown in FIGS. 3 and 4. The same resin adhesive as used in Example 1 was used. While details of FIGS. 3 and 4 are not particularly described as for the same points as in FIG. 1, the explanation about FIG. 1 applies thereto appropriately. In FIGS. 3 and 4, the same members as in FIG. 1 are given the same reference numerals.

The resin-sealed package having the abovementioned structure did not exhibit satisfactory moisture impermeability for practical use in a pressure cooker test as previously described. That is, the frequency change after a 24 hours' pressure cooker test exceeded 50 ppm when polysulfone was used as a resin adhesive, and, even in using an epoxy resin, the change exceeded 30 ppm. The package did not satisfy the requirement of 15 ppm in a 48 hours' test, the upper limit for acceptance for practical production or use.

The test pieces of Examples 1 to 4 had frequency changes of 15 ppm or less before and after a 48-hour pressure cooker test and are therefore regarded as reliable for an extended period of time in practice. Therefore, in the package according to the present invention, the device contained therein is sufficiently protected.

Because the sealing temperature is low, damage to the device on sealing can be minimized, which is another advantage of the package of the present invention.

While the invention has been described with reference to preferred embodiments thereof, these embodiments have been shown only for better understanding of the present invention, and changes and modifications can be made therein without departing from the scope of the present invention.

Industrial Applicability

According to the present invention, since the metal foil and the package body are sealed together with a resin adhesive, the production process does not include a high temperature step that may damage an electronic device. The package provides an electronic device sealed therein with protection against the environment and has high reliability. The package is also economically advantageous because the resin sealing of the metal foil and the body can be done through a simple process. The package of the present invention is therefore of very high value in practical use.

I claim:

1. A hermetically sealed package for an electronic device, comprising (a) a body which contains an electronic device therein and (b) a one-piece covering member which covers the body, wherein
   (1) the covering member consists entirely of a thin flat metal foil having a thickness of from 0.005 mm to 0.3 mm,
   (2) the body is of oxide ceramic, and
   (3) the covering member and the body are sealed together with an epoxy resin adhesive, both the foil and the body being in sealing contact with the resin adhesive.

2. A hermetically sealed package as claimed in claim 1, wherein the metal foil is stainless steel.

3. A hermetically sealed package as claimed in claim 1, wherein the surface of the metal foil adhered to the body is roughened.

4. A hermetically sealed package as claimed in claim 1, wherein the electronic device is a piezoelectric device.

5. A hermetically sealed package for an electronic device, comprising (a) a body which contains an electronic device therein and has an opening and (b) a one-piece covering member which covers the opening of the body, wherein
   (1) the covering member consists entirely of a thin flat metal foil, and
   (2) the thin metal foil of the covering member and the body are bonded via a resin adhesive to seal the cover member and the body, both the foil and the body being in sealing contact with the resin adhesive.

6. A hermetically sealed package as claimed in claim 5, wherein said body is of oxide ceramic.

7. A hermetically sealed package as claimed in claim 5, wherein said resin adhesive is an epoxy resin adhesive.

8. A hermetically sealed package as claimed in claim 5, wherein said metal foil has a thickness of from 0.005 mm to 0.3 mm.

9. A hermetically sealed package as claimed in claim 5, wherein said metal foil is stainless steel.

10. A hermetically sealed package as claimed in claim 5, wherein the surface of the metal foil to be adhered to the body is roughened.

11. A hermetically sealed package as claimed in claim 5, wherein the electronic device is a piezoelectric device.

* * * * *